(12) United States Patent
Hui et al.

(10) Patent No.: US 10,788,516 B2
(45) Date of Patent: Sep. 29, 2020

(54) POWER MEASUREMENT SYSTEM

(71) Applicant: THE UNIVERSITY OF HONG KONG, Hong Kong (CN)

(72) Inventors: Shu Yuen Ron Hui, Hong Kong (CN); Haoyuan Yang, Hong Kong (CN)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 125 days.

(21) Appl. No.: 16/081,714

(22) PCT Filed: Mar. 3, 2016

(86) PCT No.: PCT/CN2016/075444
§ 371 (c)(1),
(2) Date: Aug. 31, 2018

(87) PCT Pub. No.: WO2017/147838
PCT Pub. Date: Sep. 8, 2017

(65) Prior Publication Data
US 2019/0025347 A1    Jan. 24, 2019

(51) Int. Cl.
| G01R 15/20 | (2006.01) |
| G01R 21/133 | (2006.01) |
| G01R 21/06 | (2006.01) |
| G01R 33/06 | (2006.01) |

(52) U.S. Cl.
CPC .......... G01R 15/20 (2013.01); G01R 21/06 (2013.01); G01R 21/133 (2013.01); G01R 33/06 (2013.01)

(58) Field of Classification Search
CPC ....... G01R 21/06; G01R 33/06; G01R 21/133
See application file for complete search history.

(56) References Cited

U.S. PATENT DOCUMENTS

| 2010/0235122 A1 | 9/2010 | McCrea et al. |
| 2011/0181124 A1* | 7/2011 | Uesaka ............ H02H 1/0061 |
| | | 307/113 |
| 2012/0200291 A1* | 8/2012 | Carpenter .......... G01R 33/072 |
| | | 324/252 |

(Continued)

FOREIGN PATENT DOCUMENTS

| CN | 1568428 A | 1/2005 |
| CN | 103376354 A | 10/2013 |
| CN | 104459433 A | 3/2015 |

OTHER PUBLICATIONS

International Search Report in International Application No. PCT/CN2016/075444, filed Mar. 3, 2016.

(Continued)

*Primary Examiner* — Alvaro E Fortich
(74) *Attorney, Agent, or Firm* — Saliwanchik, Lloyd & Eisenschenk (57) ABSTRACT

A method and an apparatus of estimating power using a plurality of branch load circuits associated with a mains three phase power supply, comprises: a voltage sensor (303) coupled to a mains power supply; a non-intrusive magnetic flux sensor array (304) coupled to a plurality of branch load circuits (305), the branch load circuits (305) coupled to the main power supply; and a computing device coupled to the voltage sensor (303) and the non-intrusive magnetic flux sensor array (304), in which a set of current-flux conversion values are to be stored in memory of the computing device.

15 Claims, 2 Drawing Sheets

(56) References Cited

U.S. PATENT DOCUMENTS

| | | | |
|---|---|---|---|
| 2012/0203481 A1* | 8/2012 | Carpenter | G01R 21/133 |
| | | | 702/62 |
| 2013/0076343 A1* | 3/2013 | Carpenter | G01R 19/00 |
| | | | 324/202 |
| 2013/0162239 A1* | 6/2013 | Raju | H01F 29/02 |
| | | | 323/355 |
| 2013/0229173 A1 | 9/2013 | Bertrand | |
| 2014/0210453 A1* | 7/2014 | Ei-Essawy | G01R 15/142 |
| | | | 324/126 |
| 2015/0002137 A1* | 1/2015 | Patel | G01R 15/207 |
| | | | 324/130 |
| 2017/0090004 A1* | 3/2017 | Marshall | G01R 22/061 |

OTHER PUBLICATIONS

"Apache Hadoop", Web page <https://wiki.apache.org/hadoop>, 5 pages, Jan. 31, 2016, retrieved from the Internet Archive Wayback Machine <https://web.archive.org/web.archive.org/web/20160114163104/https://wiki.apache.org/hadoop> on Aug. 15, 2018.

* cited by examiner

POWER MEASUREMENT SYSTEM

CROSS-REFERENCE TO RELATED APPLICATION

This application is the U.S. national stage application of International Patent Application No. PCT/CN2016/075444, filed Mar. 3, 2016, the disclosure of which is incorporated herein by reference in its entirety.

TECHNICAL FIELD

This disclosure relates generally to a system for electrical power measurement.

BACKGROUND

In certain types of situations, smart meters are electronic devices that may record electric power consumption and may likewise communicate that, for example, to a utility, such as for monitoring, billing, etc., and/or to consumers who may monitor their power consumption. Smart meters may enable two-way communication between a meter and a central system. Non-contact magnetic field sensors may use tunneling magneto resistance (TMR) or Hall-effect current technology to measure a magnetic flux and may convert it to a current value as an approach to monitor mains electricity power consumption.

Mains electricity refers to a general-purpose electric power supply. Mains electric power is also referred to by several common names including, as examples: household power, household electricity, house current, power line, domestic power, wall power, line power, AC power, city power, street power, and grid power. Many different arrangements for a mains power systems exist, characterized in part, by voltage, frequency, and/or number of phases. Two non-limiting commonly used frequencies are 50 Hz and 60 Hz. Single-phase or three-phase power is commonly used today, although two-phase systems were used early in the 20th century. Many other combinations of voltage and/or frequency have been used. Industrial plants with three-phase power may more typically have different, higher voltages installed for large equipment, compared to those found for lighting and/or portable equipment.

For metering, sensors may be located on the surface of a portion of branch circuits, e.g. a circuit breaker panel. In some cases, sensors may be accommodated on a stripe with a self-adhesive tape. Such a self-adhesive magnetic flux sensing strip 101 may be located along a space adjacent to circuit breaker switches over or under a surface of a panel 102, e.g. see FIG. 1, where individual circuit breaker switches are respectively connected with a cable through which current may flow.

BRIEF DESCRIPTION OF DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. It should also be noted that directions and/or references, for example, such as up, down, top, bottom, and so on, may be used to facilitate discussion of drawings and/or are not intended to restrict application of subject matter intended to be covered by one or more claims (e.g., claimed subject matter). Therefore, the following detailed description is not to be taken to limit claimed subject matter and/or equivalents.

DETAILED DESCRIPTION

References throughout this specification to one implementation, an implementation, one embodiment, an embodiment and/or the like means that a particular feature, structure, and/or characteristic described in relation to a particular implementation and/or embodiment is included in at least one implementation and/or embodiment of subject matter intended to be covered by one or more claims. Thus, appearances of such phrases, for example, in various places throughout this specification are not necessarily intended to refer to the same implementation and/or embodiment or to any one particular implementation and/or embodiment. Furthermore, it is to be understood that particular features, structures, and/or characteristics described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the patent application, particular context of description and/or usage provides helpful guidance regarding reasonable inferences to be drawn; however, likewise, in general, "in this context" in general without further qualification refers to the context of the present patent application.

Figure 1:
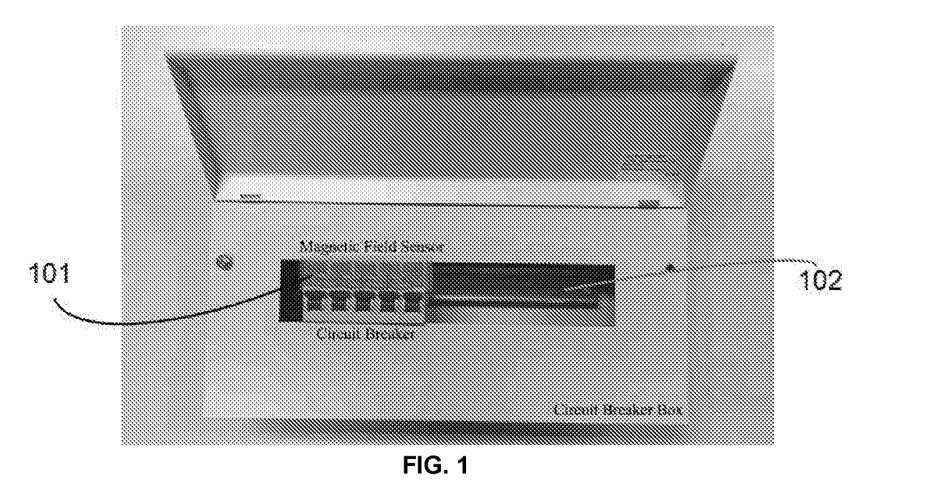
FIG. 1 is an image showing a magnetic field sensor array located on a circuit breaker panel.

In an embodiment of a power measurement system, such as shown in FIG. 1 and alluded to previously, a smart meter may use self-adhesive current sensors for relatively easy installation with relatively acceptable current measurements. However, corresponding power estimations may not be sufficiently accurate, if it is assumed that currents and corresponding voltages are in phase and that magnitude of a mains voltage is constant.

Figure 2:
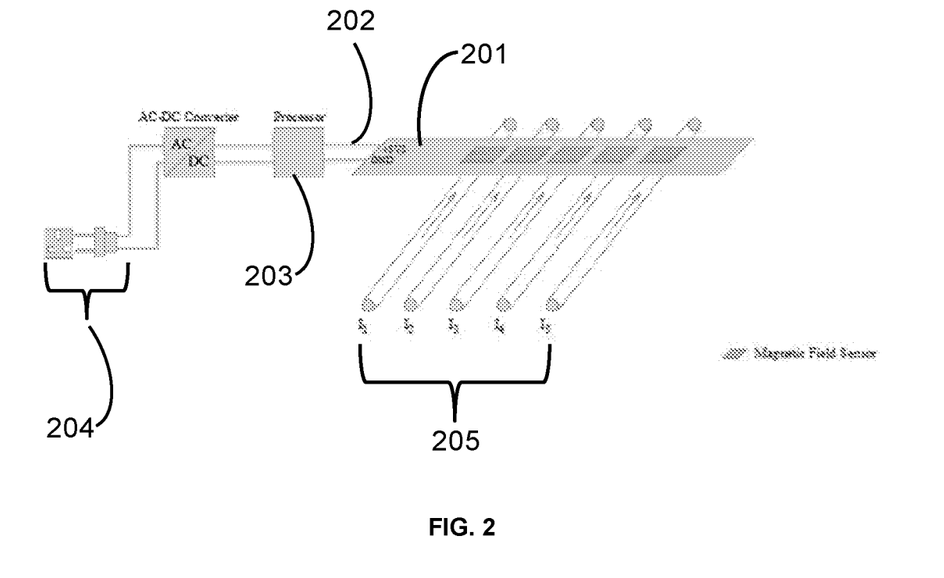
FIG. 2 is a diagram illustrating an embodiment of a power measurement system.

FIG. 2 shows an embodiment 200 of a power measurement system. Embodiment 200 includes a magnetic flux sensing strip 201 and a communication bus 202 connected to a processor 203, e.g. a micro-controller unit (MCU) or a central processing unit (CPU). Power generated from a mains electric power generator 204 may be estimated via measurement of magnetic flux associated with current flowing via branch circuits 205 associate with generator 204, using a calculation approach, for example. In some cases, there may be a wireless communication circuit to transmit measurements and/or estimates via a network, such as a computing and/or communications network, for example.

Issues, however, related to embodiment 200 of FIG. 2, for example, are explained as follows. Mains power quality is typically regulated, so that it is assumed to be sinusoidal with distortion and harmonic components being relatively negligible. Under this assumption, a power estimate per phase may be expressed substantially in accordance with the following:

$$P = V \cdot I \cdot \cos(\varphi) \quad (1)$$

and $$I = \sqrt{I_{h1}^2 + \Sigma_{n=2}^{\infty} I_{hn}^2} \quad (2)$$

where P comprises a power estimate, V comprises a phase voltage estimate or measurement, I comprises a phase current measurement or estimate, and $I_{h1}$ comprises a measurement or estimate of a fundamental component of I, with $I_{hn}$ comprising a measurement or estimate of the $n^{th}$ harmonic of I, and the cosine term comprises a power factor where $\varphi$ comprises an angle measurement or estimate between the fundamental component estimate or measurement and the phase voltage V estimate or measurement. Voltage and current measurement are typically taken as root mean square (rms) values, such as for an embodiment.

Embodiment of FIG. 2 has at least two issues that may potentially lead to a power estimation error. First, if a power factor cos (φ) is assumed to be 1.0 in relation (1), a power estimation may result in an error even assuming a current estimation is reasonably accurate. For example, if a load has reactive components, e.g. inductive and/or capacitive components, in addition to a resistive component, so that current, as an example, lags voltage by 37 degrees, cos (φ) has a value of 0.8. Therefore, if it is assumed that current and voltage are in phase and a power factor of unity (cos (φ)=1.0) were employed and an error in power estimation may likely occur. Second, if phase voltage is not measured in real time, e.g., if, rather, for low-cost and/or system simplicity, a technique was to assume a voltage magnitude in relation (1) to be equal to a nominal mains voltage, whereas in practice, a mains voltage magnitude may vary, a power estimation error may also result.

Thus, embodiments of claimed subject matter may address a variety of potential power estimation assumptions. For example, phase relationships among various power phases are not necessarily immediately available. Likewise, a power factor or phase angle between a mains voltage phase and associated current may also not be immediately available or easily obtained. Further, in FIG. 2, conversion from magnetic fluxes generated by branch circuits 205 is shown as an approach to estimate current; however, it is likewise noted that mutual inductance may potentially affect quality of measurements taken. Likewise, as alluded to, a variation in a mains voltage magnitude also may affect power estimates. Further, in a situation involving a breaker circuit panel, for example, a limited ability to take measurements directly is available if cost is to be acceptable. In other words, rewiring, for example, may not be desirable since it may add potentially more cost than desirable.

In one embodiment, to at least partially address the foregoing, a technique to estimate power, for example, may select a current phase in which power for the selected phase appears to exceed power relative to other phases in a branch circuit, as described in example embodiments below. Relation (1) indicates that accurate measurements of voltage, current, and phase angle may be employed to properly obtain a reasonably accurate estimate of power. In a typical electric power system, as previously suggested, there are three phases, e.g. labeled Phase-A, Phase-B and Phase-C, as an example. In the embodiment shown in FIG. 2, if phase voltages are not measured, and/or peak voltage magnitude is assumed to be constant and in phase with measured current, then a power measurement error may occur, as previously explained.

Figure 3:
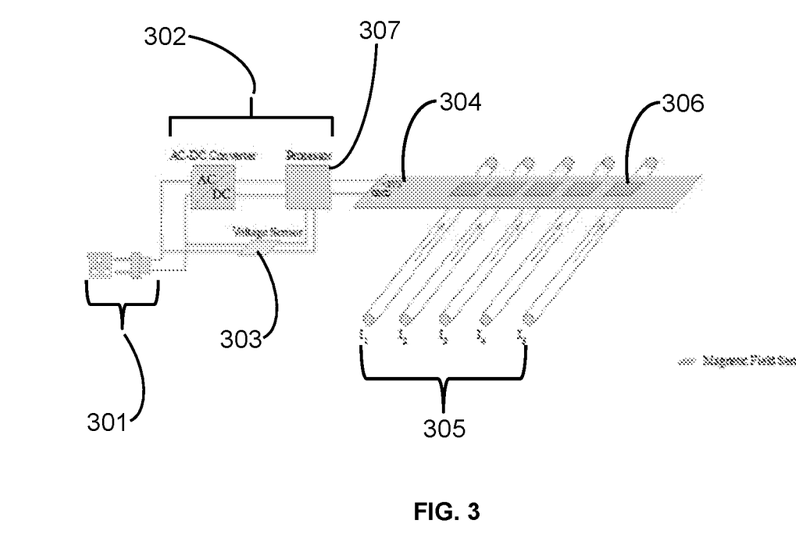
FIG. 3 is a diagram illustrating another embodiment of a power measurement system.

Another embodiment, 300, however, is shown in FIG. 3. A mains power source 301, comparable to generator 204 of FIG. 2, is connected to a processor circuit 302 and coupled with a voltage sensor 303. Thus, one of the mains voltage phases is selected for measurement as a type of voltage reference, e.g. noted as a Phase-A voltage. The other two phase voltages are assigned as Phase-B and Phase-C, which are approximately +120° and −120° respectively out of phase with voltage $V(\phi_A)$. Further, voltage $V(\phi_A)$ may be sampled, such as at a frequency relatively higher than a mains power frequency.

Likewise, load branch currents 305, associated with a load comparable to branch circuits 205 of FIG. 2, may be sensed by flux sensor array 304 may also be sampled at a frequency relatively higher than a mains frequency. Sampling techniques sufficient for specified measurement accuracy are well known and may include periodic or random sampling, typically at sampling rates above the Nyquist frequency and over sampling intervals at least corresponding to the duration of one voltage phase cycle, for example, may be employed.

Individual magnetic flux sensors, e.g. sensor 306, are located at positions along magnetic flux sensor array 304, such that respective sensors are located in relative proximity to a respective current carrying circuit in branch load circuits 305. For convenience in clarifying various factors for power estimation, such as measured voltage, load current sensed with a non-intrusive magnetic flux sensor, and relative phase, relation (1) may be rewritten substantially in accordance with the following:

$$P_j(\phi_k) = V(\phi_A) \cdot I_j(\phi_k) \cdot \cos(\phi_k)$$

where index j is associated with a $j^{th}$ branch circuit in load 305. Index k labels a phase angle $\phi_k$ between a measured voltage $V(\phi_A)$ and a $k^{th}$ current phase in a $j^{th}$ circuit $I_j(\phi_k)$, e.g. index k corresponds to 1, 2, or 3 for a three phase mains electricity source. Current is converted from magnetic flux samples, e.g. a sample measurement from a sensor 306, which is located in relatively close proximity to a corresponding branch circuit, for example. Techniques for estimating power associated with a $j^{th}$ branch circuit as a product of a phase voltage $V(\phi_A)$, a $k^{th}$ current phase in a $j^{th}$ circuit $I_j(\phi_k)$, and a power factor $\cos(\phi_k)$ corresponding to a $k^{th}$ phase angle $\phi_k$, is further described below, for an embodiment, for example.

Sampled voltage measurements are synchronized in time with magnetic flux measurements, which are converted to current values used to calculate a power estimate to be associated with a branch circuit, e.g. corresponding to a current flowing through a circuit breaker. One synchronization technique uses a clock, e.g. a clock involved with operation of processor 307, for an embodiment, to determine time relationships between voltage measurement samples and magnetic flux measurement samples. Via time synchronization of measurements, a phase angle associated with a branch circuit may be estimated, in an embodiment.

A processor 307, for example, in an embodiment, is capable of executing executable computer instructions, such as may be fetched from memory, for example, for execution by a computing device that, for example, includes a processor, a memory and a communication bus. For example, magnetic flux measurements may be processed by a technique to estimate one or more currents flowing in one or more respective branch circuits. However, as previously alluded to, mutual coupling effects may be present among array sensors. Thus, processing of magnetic flux measurements to at least partially compensate for mutual coupling effects may be desirable.

Assuming there are m current paths, e.g. as shown in FIG. 3, which may be associated with respective circuit breakers, a relationship between measured magnetic flux values and corresponding currents may be expressed substantially in accordance with a matrix relation (3a):

$$\Phi = AI \quad (3a)$$

where $\Phi$ comprises a magnetic flux vector including magnetic flux measurements, A comprises a system matrix having component values to be estimated and I comprises a current vector of current estimates. In an expanded form, relation (3a) may be expressed substantially in accordance with the following:

$$\begin{bmatrix} \phi_1 \\ \phi_2 \\ \vdots \\ \phi_m \end{bmatrix} = \begin{bmatrix} a_{11} & a_{12} & \ldots & a_{1m} \\ a_{21} & a_{22} & \ldots & a_{2m} \\ \vdots & \vdots & \ldots & \vdots \\ a_{m1} & a_{m2} & \ldots & a_{mm} \end{bmatrix} \begin{bmatrix} I_1 \\ I_2 \\ \vdots \\ I_m \end{bmatrix} \quad (3b)$$

where matrix component values of system matrix A may be estimated based at least in part on relative positions and orientations between magnetic flux sensors and conductors comprising branch circuits.

A technique to estimate matrix component values of A is to flow a direct current in a circuit path and measure corresponding magnetic fluxes sensed by respective flux sensors. For example, if current $I_1$ flows through a first circuit path, while the others do not have current flow, relation (3b) may be expressed substantially in accordance with the following:

$$\begin{pmatrix} \Phi_1 \\ \Phi_2 \\ \vdots \\ \Phi_n \end{pmatrix} = \begin{pmatrix} a_{11} & \ldots & a_{1n} \\ \vdots & \ddots & \vdots \\ a_{n1} & \ldots & a_{nn} \end{pmatrix} \times \begin{pmatrix} I_1 \\ 0 \\ \vdots \\ 0 \end{pmatrix} \quad (4)$$

$$\Downarrow$$

$$\Phi_1 = a_{11} I_1$$
$$\Phi_2 = a_{21} I_1$$
$$\Phi_3 = a_{31} I_1$$
$$\vdots$$

Thus, values $a_{11}$ to $a_{m1}$ may be estimated using measurements. Similarly, by having a non-zero current $I_2$ flow in a second path while other current paths have zero current, $a_{21}$ to $a_{m2}$ may be obtained. This process may be repeated to estimate component values of system matrix A.

After having estimated system matrix A, and assuming the matrix is invertible, currents may be estimated from magnetic flux measurements substantially in accordance with the following:

$$I = A^{-1} \Phi \quad (5a)$$

In an expanded form, relation (5a) is shown substantially in accordance with the following:

$$\begin{bmatrix} I_1 \\ I_2 \\ \vdots \\ I_m \end{bmatrix} = \begin{bmatrix} a_{11} & a_{12} & \ldots & a_{1m} \\ a_{21} & a_{22} & \ldots & a_{2m} \\ \vdots & \vdots & \ldots & \vdots \\ a_{m1} & a_{m2} & \ldots & a_{mm} \end{bmatrix}^{-1} \begin{bmatrix} \phi_1 \\ \phi_2 \\ \vdots \\ \phi_m \end{bmatrix} \quad (5b)$$

Matrix diagonal components comprise a "self-effect" of magnetic flux measurements by a sensor from a corresponding branch circuit current. However, off-diagonal components account for mutual coupling effects between a current in one branch circuit with flux sensors associated with other branch circuits. With these off-diagonal components, mutual coupling effects may at least partially offset.

Likewise, system matrix A may result from a calibration process for a particular setup corresponding to a set of specifications of (i) distances between adjacent branch circuits in a section of a load and (ii) distances between a flux sensor array and a load section. In an embodiment, dimensions of a branch circuit section may be reasonably standardized, e.g. corresponding to a particular circuit breaker panel so as to provide a typical distance in a section between adjacent current paths, and a non-invasive sensor array. For example, if magnetic flux sensors and associated circuitry are jointly assembled, e.g. glued on or attached with a self-adhesive tape or other similar mechanical structure for relatively easy installation, then a reasonably specified distance between magnetic flux sensors and current paths may be employed, including accounting for thickness of self-adhesive tape (or other mechanical separation) and thickness of a surface plate of a circuit breaker panel, for example. Therefore, a set of components may be employed for a relatively wide range of circuit breaker panels, as may be desirable in various situations. It is further noted, as suggested previously, and as described in more detail below, that in an embodiment, a power measurement system may couple to a network, such as a computing and/or communications network, so that a power company, a user, and/or other interested parties, may have access to power estimates.

If branch circuit load, e.g. as embodied in circuits associated with circuit breakers, has circuits mutually juxtaposed, magnetic field cross coupling should be employed for improved power estimates. For example, relation (6) provides matrix component estimates resulting from an experimental setup in which five magnetic flux sensors are placed on a self-adhesive tape, with the magnetic flux sensors placed over a set of current paths.

$$\begin{bmatrix} \Phi_1 \\ \Phi_2 \\ \Phi_3 \\ \Phi_4 \\ \Phi_5 \end{bmatrix} = \quad (6)$$

$$\begin{bmatrix} -80.5828 & -68.5483 & -31.6844 & -14.2983 & -6.4617 \\ -50.3222 & -91.0989 & -75.3544 & -38.4822 & -18.8239 \\ -23.4756 & -54.0228 & -90.6839 & -75.5328 & -35.7800 \\ -11.6650 & -24.3450 & -53.8144 & -90.1250 & -72.9100 \\ -6.0544 & -11.5544 & -23.2056 & -50.3317 & -82.2350 \end{bmatrix} \begin{bmatrix} I_1 \\ I_2 \\ I_3 \\ I_4 \\ I_5 \end{bmatrix}$$

Table 1 shows a comparison of estimated current values with and without at least partial mutual coupling compensation. Results demonstrate desirability to at least partially account for mutual coupling.

| Current | Calibration current in current path | Estimated results without mutual coupling effects | Estimated results with mutual coupling effects |
| --- | --- | --- | --- |
| $I_1$ | −3 | −1.38 | −2.99 |
| $I_2$ | 3 | −0.54 | 2.89 |
| $I_3$ | −3 | −0.75 | −2.82 |
| $I_4$ | 3 | −0.96 | 2.77 |
| $I_5$ | −3 | −1.94 | −3.02 |

In the context of the present patent application, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, which generally refers to the ability for the client and server to exchange communications, discussed in more detail later.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are in direct physically tangible, including electrically tangible (e.g., as previously discussed), contact; while, "coupled," is used to mean that two or more tangible components and/or the like are potentially in direct physically tangible, potentially including electrically tangible, contact; "coupled," nonetheless, is also used to mean that two or more tangible components and/or the like are not necessarily in direct physically tangible contact, but are able to co-operate and/or interact, such as, for example, by being "optically coupled." Likewise, in a particular context, such as in which tangible components are discussed, the term coupled is also understood to mean indirectly connected. It is further noted, in the context of the present patent application, since memory, such as a memory component and/or memory states, is intended to be non-transitory, the term physical, at least if used in relation memory necessarily implies tangible.

Additionally, in the present patent application, in a particular context of usage, such as in which tangible components (and/or similarly, tangible materials) are being discussed, a distinction exists between being "on" and being "over." As an example, deposition of a substance "on" a substrate refers to a deposition involving direct physically tangible contact without an intermediary, such as an intermediary substance, between the substance deposited and the substrate in this latter example; nonetheless, deposition "over" a substrate, while generally understood to potentially include deposition "on" a substrate (since being "on" may also accurately be described as being "over"), is generally understood to include a situation in which one or more intermediaries, such as one or more intermediary substances, are present between the substance deposited and the substrate so that the substance deposited is not necessarily in direct physically tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physically tangible contact (similar to "on," as just described), "under" potentially includes a situation in which there is direct physically tangible contact, but does not necessarily imply direct physically tangible contact, such as if one or more intermediaries, such as one or more intermediary substances, are present. Thus, "on" is understood to mean "immediately over" and "beneath" is understood to mean "immediately under."

It is likewise appreciated that terms such as "over" or "under" are understood in a similar manner as the terms up, down, top, bottom, and so on, previously mentioned. These terms may be used to facilitate discussion, but are not intended to necessarily restrict scope of subject matter covered by one or more claims. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present patent application, "or" if used to associate a list, such as A, B or C, is intended to mean A, B, and C, here used in the inclusive sense, as well as A, B or C, here used in the exclusive sense. With this understanding, "and" is used in the inclusive sense and intended to mean A, B and C; whereas "and/or" can be used in an abundance of caution to make clear that all of the foregoing meanings are intended, although such usage is not required. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described.

It is further noted that the terms "type" and/or "like" if used, such as with a feature, structure and/or characteristic, using "optical" or "electrical" as simple examples, means at least partially of and/or relating to the feature, structure and/or characteristic in such a way that presence of minor variations, even variations that might otherwise not be considered fully consistent with the feature, structure and/or characteristic, do not in general prevent the feature, structure and/or characteristic from being of a "type" and/or being "like," (such as being an "optical-type" or being "optical-like," for example) if the minor variations are sufficiently minor so that the feature, structure and/or characteristic would still be considered to be substantially present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the following description merely provides one or more illustrative examples and claimed subject matter is intended to not be limited to one or more illustrative examples; however, again, as has always been the with respect to the specification of a patent application, particular context of description and/or usage provides helpful guidance regarding reasonable inferences to be drawn.

Furthermore, if a value, such as of a physical property, as an example, relates to implementation of claimed subject matter and is subject to testing, measurement and/or specification regarding degree; however, likewise, if alternatively reasonable approaches to testing, measurement and/or specification regarding degree, at least with respect to the property, continuing with the example, are reasonably likely to occur to one of ordinary skill, in which the alternatively reasonable approaches are in general individually sufficient (e.g., adequate), at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques unless otherwise expressly indicated.

With advances in technology, it has become more typical to employ distributed computing and/or communication approaches in which portions of a problem, such as signal processing of signal samples, for example, may be allocated among various devices, including one or more client devices and/or one or more server devices, via a computing and/or communications network, for example. A network may comprise two or more devices, such as network devices and/or computing devices, and/or may couple devices, such as network devices and/or computing devices, so that signal communications, such as in the form of signal packets and/or signal frames (e.g., comprising one or more signal samples), for example, may be exchanged, such as between a server device and/or a client device, as well as other types of devices, including between wireless devices coupled via a wireless network, for example.

An example of a distributed computing system comprises the Hadoop distributed computing system, which employs a map-reduce type of architecture. In the context of the present patent application, the terms map-reduce architecture and/or similar terms are intended to refer to a distributed computing system implementation and/or embodiment for processing and/or for generating large sets of signal samples employing map and/or reduce operations for a parallel, distributed process performed over a network of devices. A map operation and/or similar terms refer to processing of signals (e.g., signal samples) to generate one or more key-value pairs and to distribute the one or more pairs to one or more devices of the system (e.g., network). A reduce operation and/or similar terms refer to processing of signals (e.g., signal samples) via a summary operation (e.g., such as counting the number of students in a queue, yielding name frequencies). A system may employ such an architecture, such as by marshaling distributed servers, running various tasks in parallel, and/or managing communications, such as signal transfers, between various parts of the system (e.g., network), in an embodiment. As mentioned, one non-limiting, but well-known, example comprises the Hadoop distributed computing system. It refers to an open source implementation and/or embodiment of a map-reduce type architecture (see http://wiki.apache.org/hadoop), but may include other aspects, such as the Hadoop distributed file system (HDFS) (see http://wiki.apache.org/hadoop). In general, therefore, "Hadoop" and/or similar terms refer to an implementation and/or embodiment of a scheduler for executing large processing jobs using a map-reduce architecture over a distributed system. Furthermore, in the context of the present patent application, use of the term "Hadoop" is intended to include versions, presently known and/or to be later developed.

In the context of the present patent application, the term network device refers to any device capable of communicating via and/or as part of a network and may comprise a computing device. While network devices may be capable of communicating signals (e.g., signal packets and/or frames), such as via a wired and/or wireless network, they may also be capable of performing operations associated with a computing device, such as arithmetic and/or logic operations, processing and/or storing signals (e.g., signal samples), such as in memory as tangible, physical memory states, and/or may, for example, operate as a server and/or a client in various embodiments. Network devices capable of operating as a server, a client and/or otherwise, may include, as examples, dedicated rack-mounted servers, desktop computers, laptop computers, set top boxes, tablets, netbooks, smart phones, wearable devices, integrated devices combining two or more features of the foregoing devices, the like or any combination thereof. As mentioned, signal packets and/or frames, for example, may be exchanged, such as between a server device and/or a client device, as well as other types of devices, including between wireless devices coupled via a wireless network, for example. It is noted that the terms, server, server device, server computing device, server computing platform and/or similar terms are used interchangeably. Similarly, the terms client, client device, client computing device, client computing platform and/or similar terms are also used interchangeably. While in some instances, for ease of description, these terms may be used in the singular, such as by referring to a "client device" or a "server device," the description is intended to encompass one or more client devices and/or one or more server devices, as appropriate. Along similar lines, references to a "database" are understood to mean, one or more databases and/or portions thereof, as appropriate.

It should be understood that for ease of description, a network device (also referred to as a networking device) may be embodied and/or described in terms of a computing device and vice-versa. However, it should further be understood that this description should in no way be construed so that claimed subject matter is limited to one embodiment, such as only a computing device and/or only a network device, and, instead, may be embodied as a variety of devices or combinations thereof, including, for example, one or more illustrative examples.

A network may also include now known, and/or to be later developed arrangements, derivatives, and/or improvements, including, for example, past, present and/or future mass storage, such as network attached storage (NAS), a storage area network (SAN), and/or other forms of device readable media, for example. A network may include a portion of the Internet, one or more local area networks (LANs), one or more wide area networks (WANs), wire-line type connections, wireless type connections, other connections, or any combination thereof. Thus, a network may be worldwide in scope and/or extent. Likewise, sub-networks, such as may employ differing architectures and/or may be substantially compliant and/or substantially compatible with differing protocols, such as network computing and/or communications protocols (e.g., network protocols), may interoperate within a larger network.

In the context of the present patent application, the term sub-network and/or similar terms, if used, for example, with respect to a network, refers to the network and/or a part thereof. Sub-networks may also comprise links, such as physical links, connecting and/or coupling nodes, so as to be capable to communicate signal packets and/or frames between devices of particular nodes, including via wired links, wireless links, or combinations thereof. Various types of devices, such as network devices and/or computing devices, may be made available so that device interoperability is enabled and/or, in at least some instances, may be transparent. In the context of the present patent application, the term transparent, if used with respect to devices of a network, refers to devices communicating via the network in which the devices are able to communicate via one or more intermediate devices, such as of one or more intermediate nodes, but without the communicating devices necessarily specifying the one or more intermediate nodes and/or the one or more intermediate devices of the one or more intermediate nodes and/or, thus, may include within the network the devices communicating via the one or more intermediate nodes and/or the one or more intermediate devices of the one or more intermediate nodes, but may engage in signal communications as if such intermediate nodes and/or intermediate devices are not necessarily involved. For example, a router may provide a link and/or connection between otherwise separate and/or independent LANs.

In the context of the present patent application, a private network refers to a particular, limited set of devices, such as network devices and/or computing devices, able to communicate with other devices, such as network devices and/or computing devices, in the particular, limited set, such as via signal packet and/or signal frame communications, for example, without a need for re-routing and/or redirecting signal communications. A private network may comprise a stand-alone network; however, a private network may also comprise a subset of a larger network, such as, for example, without limitation, all or a portion of the Internet. Thus, for example, a private network "in the cloud" may refer to a private network that comprises a subset of the Internet, for example. Although signal packet and/or frame communications (e.g. signal communications) may employ intermediate devices of intermediate nodes to exchange signal packets and/or signal frames, those intermediate devices may not necessarily be included in the private network by not being a source or designated destination for one or more signal packets and/or signal frames, for example. It is understood in the context of the present patent application that a private network may direct outgoing signal communications to devices not in the private network, but devices outside the private network may not necessarily be able to direct inbound signal communications to devices included in the private network.

The Internet refers to a decentralized global network of interoperable networks that comply with the Internet Protocol (IP). It is noted that there are several versions of the Internet Protocol. The term Internet Protocol, IP, and/or similar terms are intended to refer to any version, now known and/or to be later developed. The Internet includes local area networks (LANs), wide area networks (WANs), wireless networks, and/or long haul public networks that, for example, may allow signal packets and/or frames to be communicated between LANs. The term World Wide Web (WWW or Web) and/or similar terms may also be used, although it refers to a part of the Internet that complies with the Hypertext Transfer Protocol (HTTP). For example, network devices may engage in an HTTP session through an exchange of appropriately substantially compatible and/or substantially compliant signal packets and/or frames. It is noted that there are several versions of the Hypertext Transfer Protocol. The term Hypertext Transfer Protocol, HTTP, and/or similar terms are intended to refer to any version, now known and/or to be later developed. It is likewise noted that in various places in this document substitution of the term Internet with the term World Wide Web ("Web") may be made without a significant departure in meaning and may, therefore, also be understood in that manner if the statement would remain correct with such a substitution.

Although claimed subject matter is not in particular limited in scope to the Internet and/or to the Web; nonetheless, the Internet and/or the Web may without limitation provide a useful example of an embodiment at least for purposes of illustration. As indicated, the Internet and/or the Web may comprise a worldwide system of interoperable networks, including interoperable devices within those networks. The Internet and/or Web has evolved to a public, self-sustaining facility accessible to tens of millions of people or more worldwide. Also, in an embodiment, and as mentioned above, the terms "WWW" and/or "Web" refer to a part of the Internet that complies with the Hypertext Transfer Protocol. The Internet and/or the Web, therefore, in the context of the present patent application, may comprise a service that organizes stored digital content, such as, for example, text, images, video, etc., through the use of hypermedia, for example. It is noted that a network, such as the Internet and/or Web, may be employed to store electronic files and/or electronic documents.

The term electronic file and/or the term electronic document are used throughout this document to refer to a set of stored memory states and/or a set of physical signals associated in a manner so as to thereby at least logically form a file (e.g., electronic) and/or an electronic document. That is, it is not meant to implicitly reference a particular syntax, format and/or approach used, for example, with respect to a set of associated memory states and/or a set of associated physical signals. If a particular type of file storage format and/or syntax, for example, is intended, it is referenced expressly. It is further noted an association of memory states, for example, may be in a logical sense and not necessarily in a tangible, physical sense. Thus, although signal and/or state components of a file and/or an electronic document, for example, are to be associated logically, storage thereof, for example, may reside in one or more different places in a tangible, physical memory, in an embodiment.

A HyperText Markup Language ("HTML"), for example, may be utilized to specify digital content and/or to specify a format thereof, such as in the form of an electronic file and/or an electronic document, such as a Web page, Web site, etc., for example. An Extensible Markup Language ("XML") may also be utilized to specify digital content and/or to specify a format thereof, such as in the form of an electronic file and/or an electronic document, such as a Web page, Web site, etc., in an embodiment. Of course, HTML and/or XML are merely examples of "markup" languages, provided as non-limiting illustrations. Furthermore, HTML and/or XML are intended to refer to any version, now known and/or to be later developed, of these languages. Likewise, claimed subject matter are not intended to be limited to examples provided as illustrations, of course.

In the context of the present patent application, the term "Web site" and/or similar terms refer to Web pages that are associated electronically to form a particular collection thereof. Also, in the context of the present patent application, "Web page" and/or similar terms refer to an electronic file and/or an electronic document accessible via a network, including by specifying a uniform resource locator (URL) for accessibility via the Web, in an example embodiment. As alluded to above, in one or more embodiments, a Web page may comprise digital content coded (e.g., via computer instructions) using one or more languages, such as, for example, markup languages, including HTML and/or XML, although claimed subject matter is not limited in scope in this respect. Also, in one or more embodiments, application developers may write code (e.g., computer instructions) in the form of JavaScript, for example, executable by a computing device to provide digital content to populate an electronic document and/or an electronic file in an appropriate format, such as for use in a particular application, for example. The term "JavaScript" and/or similar terms are intended to refer to any version, now known and/or to be later developed. However, JavaScript is merely an example programming language. As was mentioned, claimed subject matter is not intended to be limited to examples and/or illustrations.

In the context of the present patent application, the terms "entry," "electronic entry," "document," "electronic document," "content,", "digital content," "item," and/or similar terms are meant to refer to signals and/or states in a physical format, such as a digital signal and/or digital state format, e.g., that may be perceived by a user if displayed, played and/or otherwise executed by a device, such as a digital device, including, for example, a computing device, but otherwise might not necessarily be readily perceivable by humans (e.g., if in a digital format). Likewise, in the context of the present patent application, digital content provided to a user in a form so that the user is able to readily perceive underlying content itself (e.g., content presented in a form consumable by a human, such as hearing audio and/or seeing images, as examples) is referred to, with respect to the user, as "consuming" digital content, "consumption" of digital content, "consumable" digital content and/or similar terms. For one or more embodiments, an electronic document and/or an electronic file may comprise a Web page of code (e.g., computer instructions) in a markup language, such as, for example, HTML (hypertext markup language), as previously described, executed or to be executed by a computing and/or networking device, for example. In another embodiment, an electronic document and/or an electronic file may comprise a portion and/or a region of a Web page. However, claimed subject matter is not intended to be limited in these respects.

Also, for one or more embodiments, an electronic document and/or electronic file may comprise a number of components. As previously indicated, in the context of the present patent application, a component is physical, but is not necessarily tangible. As an example, components with reference to an electronic document and/or electronic file, in one or more embodiments, may comprise text, for example, in the form of physical signals and/or physical states (e.g., capable of being physically displayed). Typically, memory states, for example, comprise tangible components, whereas physical signals are not necessarily tangible, although signals may become (e.g., be made) tangible, such as if appearing on a tangible display, for example, as is not uncommon. Also, for one or more embodiments, components with reference to an electronic document and/or electronic file may comprise a graphical object, such as, for example, an image, such as a digital image, and/or sub-objects, including attributes thereof, which, again, comprise physical signals and/or physical states (e.g., capable of being tangibly displayed). In an embodiment, digital content may comprise, for example, text, images, audio, video, and/or other types of electronic documents and/or electronic files, including portions thereof, for example.

Also, in the context of the present patent application, the term parameters (e.g., one or more parameters) refer to material descriptive of a collection of signal samples, such as one or more electronic documents and/or electronic files, and exist in the form of physical signals and/or physical states, such as memory states. For example, one or more parameters, such as referring to an electronic document and/or an electronic file comprising an image, may include, as examples, time of day at which an image was captured, latitude and longitude of an image capture device, such as a camera, for example, etc. In another example, one or more parameters relevant to digital content, such as digital content comprising a technical article, as an example, may include one or more authors, for example. Claimed subject matter is intended to embrace meaningful, descriptive parameters in any format, so long as the one or more parameters comprise physical signals and/or states, which may include, as parameter examples, collection name (e.g., electronic file and/or electronic document identifier name), technique of creation, purpose of creation, time and date of creation, logical path if stored, coding formats (e.g., type of computer instructions, such as a markup language) and/or standards and/or specifications used so as to be protocol compliant (e.g., meaning substantially compliant and/or substantially compatible) for one or more uses, and so forth.

Signal packet communications and/or signal frame communications, also referred to as signal packet transmissions and/or signal frame transmissions (or merely "signal packets" or "signal frames"), may be communicated between nodes of a network, where a node may comprise one or more network devices and/or one or more computing devices, for example. As an illustrative example, but without limitation, a node may comprise one or more sites employing a local network address, such as in a local network address space. Likewise, a device, such as a network device and/or a computing device, may be associated with that node. It is also noted that in the context of this patent application, the term transmission is intended as another term for a type of signal communication that may occur in any one of a variety of situations. Thus, it is not intended to imply a particular directionality of communication and/or a particular initiating end of a communication path for the "transmission" communication. For example, the mere use of the term in and of itself is not intended, in the context of the present patent application, to have particular implications with respect to the one or more signals being communicated, such as, for example, whether the signals are being communicated "to" a particular device, whether the signals are being "from" a particular device, and/or regarding which end of a communication path may be initiating communication, such as, for example, in a "push type" of signal transfer or in a "pull type" of signal transfer. In the context of the present patent application, push and/or pull type signal transfers are distinguished by which end of a communications path initiates signal transfer.

Thus, a signal packet and/or frame may, as an example, be communicated via a communication channel and/or a communication path, such as comprising a portion of the Internet and/or the Web, from a site via an access node coupled to the Internet or vice-versa. Likewise, a signal packet and/or frame may be forwarded via network nodes to a target site coupled to a local network, for example. A signal packet and/or frame communicated via the Internet and/or the Web, for example, may be routed via a path, either being "pushed" or "pulled," comprising one or more gateways, servers, etc. that may, for example, route a signal packet and/or frame, such as, for example, substantially in accordance with a target and/or destination address and availability of a network path of network nodes to the target and/or destination address. Although the Internet and/or the Web comprise a network of interoperable networks, not all of those interoperable networks are necessarily available and/or accessible to the public.

In the context of the particular patent application, a network protocol, such as for communicating between devices of a network, may be characterized, at least in part, substantially in accordance with a layered description, such as the so-called Open Systems Interconnection (OSI) seven-layer type of approach and/or description. A network computing and/or communications protocol (also referred to as a network protocol) refers to a set of signaling conventions, such as for communication transmissions, for example, as may take place between and/or among devices in a network. In the context of the present patent application, the term "between" and/or similar terms are understood to include "among" if appropriate for the particular usage and vice-versa. Likewise, in the context of the present patent application, the terms "compatible with," "comply with" and/or similar terms are understood to respectively include substantial compatibility and/or substantial compliance.

A network protocol, such as protocols characterized substantially in accordance with the aforementioned OSI description, has several layers. These layers are referred to as a network stack. Various types of communications (e.g., transmissions), such as network communications, may occur across various layers. A lowest level layer in a network stack, such as the so-called physical layer, may characterize how symbols (e.g., bits and/or bytes) are communicated as one or more signals (and/or signal samples) via a physical medium (e.g., twisted pair copper wire, coaxial cable, fiber optic cable, wireless air interface, combinations thereof, etc.). Progressing to higher-level layers in a network protocol stack, additional operations and/or features may be available via engaging in communications that are substantially compatible and/or substantially compliant with a particular network protocol at these higher-level layers. For example, higher-level layers of a network protocol may, for example, affect device permissions, user permissions, etc.

Figure 4:
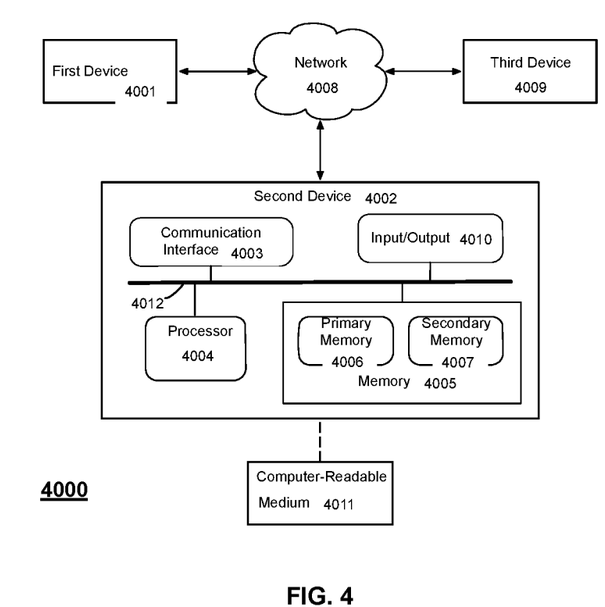
FIG. 4 is an illustration of an embodiment of computing devices, such as for a networking environment.

In one example embodiment, a system embodiment may comprise, for example, a local network and/or another type of network, such as a computing and/or communications network, described in more detail earlier, as an example. For purposes of illustration, FIG. 4 shows an embodiment 4000 of a system that may be employed to implement either type or both types of networks. Example devices in FIG. 4 may comprise features, for example, of a client computing device and/or a server computing device, in an embodiment. It is further noted that the term computing device, in general, whether employed as a client and/or as a server, or otherwise, refers at least to a processor and a memory connected by a communication bus. Likewise, in the context of the present patent application at least, this is understood to refer to sufficient structure within the meaning of section 35 USC 112 (f) so that it is specifically intended that section 35 USC 112 (f) not be implicated by use of the term "computing device" and/or similar terms; however, if it is determined, for some reason not immediately apparent, that the foregoing understanding cannot stand and that section 35 USC 112(f), therefore, necessarily is implicated by the use of the term "computing device" and/or similar terms, then, it is intended, pursuant to that statutory section, that corresponding structure, material and/or acts for performing one or more functions be understood and be interpreted to be described in the foregoing paragraphs 11 and 13-19 of the present patent application.

Referring now to FIG. 4, in an embodiment, first and third devices 4001 and 4009 may be capable of rendering a graphical user interface (GUI) for a network device and/or a computing device, for example, so that a user-operator may engage in system use. Device 4002 may potentially serve a similar function in this illustration. Likewise, in FIG. 4, computing device 4001 ('first device' in figure) may interface with computing device 4002 ('second device' in figure), which may, for example, also comprise features of a client computing device and/or a server computing device, in an embodiment. Processor (e.g., processing device) 4004 and memory 4005, which may comprise primary memory 4006 and secondary memory 4007, may communicate by way of a communication bus 4012, for example.

In FIG. 4, computing device 4001 may provide one or more sources of executable computer instructions in the form of physical states and/or signals, for example. Computing device 4001 may communicate with computing device 4002 by way of a network connection, via network 4008, for example. As previously mentioned, a connection, while physical, may not necessarily be tangible. Thus, in this latter example, "connection," as for a computing and/or communications network, refers to an ability to exchange signals, such as signal packets and/or frames, for example; and, therefore, typically refers to a non-tangible connection; whereas, as explained previously, "connection" is also used in some other situations to indicate that two or more tangible components and/or the like, for example, are in direct physically tangible contact, such as previously discussed. It is noted, in particular, since memory is intended to be non-transitory, that the term physical, if used in relation to memory (e.g., memory states, memory components) implies physically tangible memory. It is further noted an association of memory states may be in a logical sense and not necessarily in a tangible, physical sense. Thus, for example, although signal and/or state components of a file, for example, are to be associated logically, storage thereof, for example, may reside in one or more different places in a tangible, physical memory, in an embodiment, also previously discussed.

Although computing device 4002 of FIG. 4 shows various tangible, physical components, claimed subject matter is not limited to computing devices having only these tangible components as other implementations and/or embodiments may include alternative arrangements that may comprise additional tangible components or fewer tangible components, for example, that function differently while achieving similar results. Rather, examples are provided merely as illustrations. It is not intended that claimed subject matter be limited in scope to illustrative examples.

Processor 4004 may comprise one or more circuits, such as digital circuits, to perform at least a portion of a computing procedure and/or process. By way of example, but not limitation, processor 4004 may comprise one or more processors, such as controllers, microprocessors, microcontrollers, application specific integrated circuits, digital signal processors, programmable logic devices, field programmable gate arrays, the like, or any combination thereof. In implementations and/or embodiments, processor 4004 may perform signal processing, typically substantially in accordance with fetched executable computer instructions, such as to manipulate signals and/or states, to construct signals and/or states, etc., with signals and/or states generated in such a manner to be communicated and/or stored in memory, for example.

Memory 4005 may comprise any non-transitory storage mechanism. Memory 4005 may comprise, for example, primary memory 4006 and secondary memory 4007, additional memory circuits, mechanisms, or combinations thereof may be used. Memory 4005 may comprise, for example, random access memory, read only memory, etc., such as in the form of one or more storage devices and/or systems, such as, for example, a disk drive including an optical disc drive, a tape drive, a solid-state memory drive, etc., just to name a few examples.

Memory 4005 may be utilized to store a program of executable computer instructions. For example, processor 4004 may fetch executable instructions from memory and proceed to execute the fetched instructions. Memory 4005 may also comprise a memory controller for accessing device readable-medium 4011 that may carry and/or make accessible digital content, which may include code, and/or instructions, for example, executable by processor 4004 and/or some other device, such as a controller, as one example, capable of executing computer instructions, for example.

Under direction of processor 4004, a non-transitory memory, such as memory cells storing physical states (e.g., memory states), comprising, for example, a program of executable computer instructions, may be executed by processor 4004 and able to generate signals to be communicated via a network, for example, as previously described. Generated signals may also be stored in memory, also previously suggested.

Network 4008 may comprise one or more network connections, links, processes, services, applications and/or resources to support exchanging communication signals between a computing device, such as 4001, and another computing device, such as 4009, which may, for example, comprise one or more client computing devices and/or one or more server computing device. By way of example, but not limitation, network 4008 may comprise wireless and/or wired communication links, telephone and/or telecommunications systems, Wi-Fi networks, Wi-MAX networks, the Internet, a local area network (LAN), a wide area network (WAN), or any combinations thereof.

The term "computing device," in the context of the present patent application, refers to a system and/or a device, such as a computing apparatus, that includes a capability to process (e.g., perform computations) and/or store digital content, such as electronic files, electronic documents, measurements, text, images, video, audio, etc. in the form of signals and/or states. Thus, a computing device, in the context of the present patent application, may comprise hardware, software, firmware, or any combination thereof (other than software per se). Computing device 4002, as depicted in FIG. 4, is merely one example, and claimed subject matter is not limited in scope to this particular example.

For one or more embodiments, a computing device may comprise any of a wide range of digital electronic devices, including, but not limited to, desktop and/or notebook computers, high-definition televisions, digital versatile disc (DVD) and/or other optical disc players and/or recorders, game consoles, satellite television receivers, cellular telephones, tablet devices, wearable devices, personal digital assistants, mobile audio and/or video playback and/or recording devices, or any combination of the foregoing. Further, unless specifically stated otherwise, a process as described, such as with reference to flow diagrams and/or otherwise, may also be executed and/or affected, in whole or in part, by a computing device and/or a network device.

Memory 4005 may store electronic files and/or electronic documents, such as relating to one or more users, and may also comprise a computer-readable medium that may carry and/or make accessible content, including code and/or instructions, for example, executable by processor 4004 and/or some other device, such as a controller, as one example, capable of executing computer instructions, for example. As previously mentioned, the term electronic file and/or the term electronic document are used throughout this document to refer to a set of stored memory states and/or a set of physical signals associated in a manner so as to thereby form an electronic file and/or an electronic document. That is, it is not meant to implicitly reference a particular syntax, format and/or approach used, for example, with respect to a set of associated memory states and/or a set of associated physical signals. It is further noted an association of memory states, for example, may be in a logical sense and not necessarily in a tangible, physical sense. Thus, although signal and/or state components of an electronic file and/or electronic document, are to be associated logically, storage thereof, for example, may reside in one or more different places in a tangible, physical memory, in an embodiment.

FIG. 4 illustrates device 4002 as including a component 4010 operable with input/output devices, for example, so that signals and/or states may be appropriately communicated between devices, such as device 4002 and an input device and/or device 4002 and an output device. A user may make use of an input device, such as a computer mouse, stylus, track ball, keyboard, and/or any other similar device capable of receiving user actions and/or motions as input signals. Likewise, a user may make use of an output device, such as a display, a printer, etc., and/or any other device capable of providing signals and/or generating stimuli for a user, such as visual stimuli, audio stimuli and/or other similar stimuli.

Regarding aspects related to a network, including a communications and/or computing network, a wireless network may couple devices, including client devices, with the network. A wireless network may employ stand-alone, ad-hoc networks, mesh networks, Wireless LAN (WLAN) networks, cellular networks, and/or the like. A wireless network may further include a system of terminals, gateways, routers, and/or the like coupled by wireless radio links, and/or the like, which may move freely, randomly and/or organize themselves arbitrarily, such that network topology may change, at times even rapidly. A wireless network may further employ a plurality of network access technologies, including aversion of Long Term Evolution (LTE), WLAN, Wireless Router (WR) mesh, 2nd, 3rd, or 4th generation (2G, 3G, or 4G) cellular technology and/or the like, whether currently known and/or to be later developed. Network access technologies may enable wide area coverage for devices, such as computing devices and/or network devices, with varying degrees of mobility, for example.

A network may enable radio frequency and/or other wireless type communications via a wireless network access technology and/or air interface, such as Global System for Mobile communication (GSM), Universal Mobile Telecommunications System (UMTS), General Packet Radio Services (GPRS), Enhanced Data GSM Environment (EDGE), 3GPP Long Term Evolution (LTE), LTE Advanced, Wideband Code Division Multiple Access (WCDMA), Bluetooth, ultra-wideband (UWB), 802.11b/g/n, and/or the like. A wireless network may include virtually any type of now known and/or to be developed wireless communication mechanism and/or wireless communications protocol by which signals may be communicated between devices, between networks, within a network, and/or the like, including the foregoing, of course.

As suggested previously, communications between a computing device and/or a network device and a wireless network may be in accordance with known and/or to be developed network protocols including, for example, global system for mobile communications (GSM), enhanced data rate for GSM evolution (EDGE), 802.11b/g/n, and/or worldwide interoperability for microwave access (WiMAX). A computing device and/or a networking device may also have a subscriber identity module (SIM) card, which, for example, may comprise a detachable or embedded smart card that is able to store subscription content of a user, and/or is also able to store a contact list. A user may own the computing device and/or network device or may otherwise be a user, such as a primary user, for example. A device may be assigned an address by a wireless network operator, a wired network operator, and/or an Internet Service Provider (ISP). For example, an address may comprise a domestic or international telephone number, an Internet Protocol (IP) address, and/or one or more other identifiers. In other embodiments, a computing and/or communications network may be embodied as a wired network, wireless network, or any combinations thereof.

A device, such as a computing device and/or network device, may vary in terms of capabilities and/or features. Claimed subject matter is intended to cover a wide range of potential variations. For example, a device may include a numeric keypad and/or other display of limited functionality, such as a monochrome liquid crystal display (LCD) for displaying text, for example. In contrast, however, as another example, a web-enabled device may include a physical and/or a virtual keyboard, mass storage, one or more accelerometers, one or more gyroscopes, global positioning system (GPS) and/or other location-identifying type capability, and/or a display with a higher degree of functionality, such as a touch-sensitive color 2D or 3D display, for example.

A computing and/or network device may include and/or may execute a variety of now known and/or to be developed operating systems, derivatives and/or versions thereof, including computer operating systems, such as Windows, iOS, Linux, a mobile operating system, such as iOS, Android, Windows Mobile, and/or the like. A computing device and/or network device may include and/or may execute a variety of possible applications, such as a client software application enabling communication with other devices. For example, one or more messages (e.g., content) may be communicated, such as via one or more protocols, now known and/or later to be developed, suitable for communication of email, short message service (SMS), and/or multimedia message service (MMS), including via a network, such as a social network, formed at least in part by a portion of a computing and/or communications network, including, but not limited to, Facebook, LinkedIn, Twitter, Flickr, and/or Google+, to provide only a few examples. A computing and/or network device may also include executable computer instructions to process and/or communicate digital content, such as, for example, textual content, digital multimedia content, and/or the like. A computing and/or network device may also include executable computer instructions to perform a variety of possible tasks, such as browsing, searching, playing various forms of digital content, including locally stored and/or streamed video, and/or games such as, but not limited to, fantasy sports leagues. The foregoing is provided merely to illustrate that claimed subject matter is intended to include a wide range of possible features and/or capabilities.

A network and/or sub-network, in an embodiment, may communicate via signal packets and/or signal frames, such via participating digital devices and may be substantially compliant and/or substantially compatible with, but is not limited to, now known and/or to be developed, versions of any of the following network protocol stacks: ARCNET, AppleTalk, ATM, Bluetooth, DECnet, Ethernet, FDDI, Frame Relay, HIPPI, IEEE 1394, IEEE 802.11, IEEE-488, Internet Protocol Suite, IPX, Myrinet, OSI Protocol Suite, QsNet, RS-232, SPX, System Network Architecture, Token Ring, USB, and/or X.25. A network and/or sub-network may employ, for example, a version, now known and/or later to be developed, of the following: TCP/IP, UDP, DECnet, NetBEUI, IPX, AppleTalk and/or the like. Versions of the Internet Protocol (IP) may include IPv4, IPv6, and/or other later to be developed versions.

Algorithmic descriptions and/or symbolic representations are examples of techniques used by those of ordinary skill in the signal processing and/or related arts to convey the substance of their work to others skilled in the art. An algorithm is, in the context of the present patent application, and generally, is considered to be a self-consistent sequence of operations and/or similar signal processing leading to a desired result. In the context of the present patent application, operations and/or processing involve physical manipulation of physical quantities. Typically, although not necessarily, such quantities may take the form of electrical and/or magnetic signals and/or states capable of being stored, transferred, combined, compared, processed and/or otherwise manipulated, for example, as electronic signals and/or states making up components of various forms of digital content, such as signal measurements, text, images, video, audio, etc.

It has proven convenient at times, principally for reasons of common usage, to refer to such physical signals and/or physical states as bits, values, elements, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically in the form of physical electronic and/or magnetic quantities, within memories, registers, and/or other storage devices, processing devices, and/or display devices of the special purpose computer and/or similar special purpose computing and/or network device. In the context of this particular patent application, as mentioned, the term "specific apparatus" therefore includes a general purpose computing and/or network device, such as a general purpose computer, once it is programmed to perform particular functions, such as pursuant to program software instructions.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation. Likewise, a physical change may comprise a transformation in molecular structure, such as from crystalline form to amorphous form or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state from a binary one to a binary zero or vice-versa in a memory device may comprise a transformation, such as a physical, but non-transitory, transformation. Rather, the foregoing is intended as illustrative examples.

In the preceding description, various aspects of claimed subject matter have been described. For purposes of explanation, specifics, such as amounts, systems and/or configurations, as examples, were set forth. In other instances, well-known features were omitted and/or simplified so as not to obscure subject matter intended to be covered by one or more claims. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

The invention claimed is:

1. A method of estimating power using a plurality of branch load circuits associated with a mains three phase power supply, comprising:
   selecting a power line voltage phase of the mains three phase power supply to sample voltage measurements;
   using a non-intrusive sensor array to measure magnetic flux generated by the plurality of branch load circuits;
   sampling voltage measurements of the selected power line voltage phase;
   synchronizing the measured magnetic flux to the sampled voltage measurements; and
   calculating a power estimate from the measured magnetic flux and the sampled voltage measurements.

2. The method of claim 1, wherein the using of the non-intrusive sensor array to measure magnetic flux generated by the plurality of branch load circuits comprises:
   collocating the non-intrusive sensor array in proximity to the branch load circuits such that respective sensor of the non-intrusive sensor array is closer to a portion of a corresponding respective branch load circuit than to the remainder of the plurality of branch load circuits; and
   measuring the magnetic flux detected at the respective sensor.

3. The method of claim 1, wherein the selecting of the power line voltage phase of the mains three phase power supply to sample voltage measurements comprises:
   sampling above a Nyquist frequency.

4. The method of claim 3, wherein the sampling above the Nyquist frequency comprises sampling at a frequency sufficient for a specified measurement accuracy.

5. The method of claim 1, wherein the synchronizing the measured magnetic flux to the sampled voltage measurements comprises:
   using a common clock to relate the sensor array sample times with respect to the voltage sample times.

6. The method of claim 5, wherein the common clock is provided by a processor clock.

7. The method of claim 1, wherein the calculating a power estimate from the measured magnetic flux and the sampled voltage measurements comprises: using estimated magnetic flux conversion components to estimate currents flowing in the branch load circuits.

8. The method of claim 7, wherein the using of the estimated magnetic flux conversion components to estimate currents flowing in the branch load circuits includes at least partially adjusting for mutual coupling of the branch load circuits.

9. The method of claim 8, wherein the calculating of the power estimate from the measured magnetic flux and the sampled voltage measurements comprises: calculating power factors associated with the estimated currents flowing in the branch load circuits based at least in part on the synchronization of the measured magnetic flux and the sampled voltage measurements.

10. The method of claim 9, wherein the calculating power factors associated with the estimated currents flowing in the branch load circuits based at least in part on the synchronization of the measured magnetic flux and the sampled voltage measurements further comprises:
    calculating phase angles between estimated currents flowing in the respective branch load circuits synchronized to the sampled voltage measurements and the synchronized sampled voltage measurements; and
    calculating respective power factors as a cosine of respective phase angles.

11. The method of claim 10, wherein the calculating of the power estimate from the measured magnetic flux and the sampled voltage measurements further comprises:
    calculating a power estimate for the respective branch load circuits as a product of: the estimated current for the respective branch, a correspondingly synchronized sampled voltage measurement, and the calculated power factor for the respective branch load circuit; and
    determining a power value estimate by selecting the respective branch load circuit power estimate having the largest absolute value.

12. An apparatus, comprising:

a voltage sensor coupled to a mains power supply;

a non-intrusive magnetic flux sensor array coupled to a plurality of branch load circuits, the branch load circuits coupled to the mains power supply; and a computing device coupled to the voltage sensor and the non-intrusive magnetic flux sensor array, in which a set of current-flux conversion values are stored in a memory of the computing device, wherein the memory further comprises a set of instructions that, when executed by a processor of the computing device, performs the following steps:

selecting a power line voltage phase of the mains power supply to sample voltage measurements with the voltage sensor;

measuring, via the non-intrusive magnetic flux sensor array, magnetic flux generated by the plurality of branch load circuits;

sampling voltage measurements of the selected power line voltage phase;

synchronizing the measured magnetic flux to the sampled voltage measurements; and calculating a power estimate from the measured magnetic flux and the sampled voltage measurements.

13. The apparatus of claim 12, wherein the voltage sensor coupled to a mains power supply comprises: a voltage sensor coupled to a phase of a three-phase alternating current electric power source.

14. The apparatus of claim 12, wherein the non-intrusive magnetic flux sensor array coupled to a plurality of branch load circuits comprises: a plurality of magnetic flux sensors collocated in proximity to the branch load circuits such that respective sensor of the non-intrusive magnetic flux sensor array is closer to a portion of a corresponding respective branch load circuit than to the remainder of the plurality of branch load circuits.

15. The apparatus of claim 12, wherein the computing device comprises an optical fiber connection to a network or wireless coupling to a network.

* * * * *